United States Patent [19]

Sridhar

[11] Patent Number: 4,601,034
[45] Date of Patent: Jul. 15, 1986

[54] METHOD AND APPARATUS FOR TESTING VERY LARGE SCALE INTEGRATED MEMORY CIRCUITS

[75] Inventor: Thirumalai Sridhar, Dallas, Tex.

[73] Assignee: Texas Instruments Incorporated, Dallas, Tex.

[21] Appl. No.: 595,065

[22] Filed: Mar. 30, 1984

[51] Int. Cl.[4] ............................................. G01R 31/28
[52] U.S. Cl. ........................................ 371/25; 371/21
[58] Field of Search ......................... 371/25, 21, 15; 364/200, 900

[56] References Cited

U.S. PATENT DOCUMENTS

| | | | |
|---|---|---|---|
| 4,369,511 | 1/1983 | Kimura et al. | 371/25 |
| 4,402,081 | 8/1983 | Ichimiya | 371/21 |
| 4,409,675 | 10/1983 | Stinchelfer | 371/21 |
| 4,412,327 | 10/1983 | Fox | 371/25 |
| 4,441,074 | 4/1984 | Bockeh-Pagh | 371/25 |
| 4,450,560 | 5/1984 | Conner | 371/25 |
| 4,481,627 | 11/1984 | Beauchesne | 371/25 |
| 4,498,172 | 2/1985 | Bhausar | 371/25 |
| 4,503,536 | 3/1985 | Panzer | 371/25 |
| 4,519,077 | 5/1985 | Amin | 371/25 |
| 4,534,030 | 8/1985 | Pacz | 371/25 |

Primary Examiner—Michael R. Fleming
Attorney, Agent, or Firm—Melvin Sharp; James T. Comfort; Richard L. Donaldson

[57] ABSTRACT

Apparatus for testing high density VLSI memory elements of a semiconductor chip having bit line connections to at least selected ones of which includes a parallel signature analyzer built onto the chip adjacent the memory elements and connected to at least some of them by the bit line connections. The parallel signature analyzer is configurable to apply selected signals onto the bit lines in one mode to enable test signals to be written into selected memory cells to generate preselected memory states therewithin. The parallel signature analyzer is also configurable, in another mode to read the states of the memory cells and to develop a signature of the states read to indicate whether the selectively applied signals were properly written into and read from the high density memory. Means are also provided for delivering the signature to an output lead in the form of a quotient bit, if desired.

12 Claims, 4 Drawing Figures

METHOD AND APPARATUS FOR TESTING VERY LARGE SCALE INTEGRATED MEMORY CIRCUITS

The U.S. Government has a paid-up license in this invention and the right in limited circumstances to require the patent owner to license others on reasonable terms as provided for by the terms of Contract No. F30602-81-C-0032 awarded by the U.S. Air Force.

BACKGROUND OF THE INVENTION

1. Field of the Invention

This invention relates to improvements in methods and apparatus for testing very large scale integrated memory circuits, and, more particularly, to improvements in methods and apparatus for testing such circuits using circuitry fabricated onto the integrated circuit chip itself.

2. Description of the Prior Art

In the design and fabrication of very large scale integrated (VLSI) memory circuits, recent emphasis has been in constructing larger and larger memory arrays onto constant or smaller sized semiconductor chips. However, as the number of memory elements included on a chip becomes larger and larger, the testing of the circuits becomes more and more difficult and requires more and more time. Thus, in the fabrication of VLSI memory arrays with a large number of memory elements, the time required for testing the arrays becomes a significant proportion of the total manufacturing process. Even after manufacture, in the field in use, often times testing a particular memory array is desired in fault checking, system diagnosis, and so forth, and when very large numbers of memory elements are involved, the testing task becomes especially significant, and sometimes extremely burdensome.

More particularly, it is very difficult to test individual memory elements of a VLSI circuit from outside the circuit, and, additionally, it is extremely time consuming to apply test patterns to the circuit from outside the chip, then read all of the memory cells of the chip and analyze the data obtained. In the past, for example, computer programs have been developed to apply particular testing algorithms to a particular memory chip or array to be tested. As each of the input signals is applied to the memory elements, they are directed to respective selected memory elements, and an output is developed which indicates whether a particular selected individual memory element has the desired contents in it. Doing this on an individual circuit-by-circuit basis (or element-by-element basis), becomes difficult when one considers the large size of memory elements contained on a single chip, for example, memory elements in excess of 256K. Thus, techniques have been developed in the past to streamline or make more efficient such testing techniques. An example of such technique outside of the LSI or integrated circuit arena, is in the provision of a parallel signature analyzer in which output signals from, for example, a memory array to be tested can be examined after a known sequence of signals have been applied and written into the memory array. The parallel signature analyzer reads the memory and develops an output which is examined and compared to an expected output signature. The signature developed by the parallel signature analyzer thus indicates that all of the memory elements are properly functioning if the known signature is developed.

In general, the memory tests commonly used involving parallel signature analyzers involve writing predetermined memory states into the memory, then reading the memory to determine whether what is read is the same as what was written. Because of the large quantity of data developed, however, it has been found that the data can be compressed by appropriate logic circuits into a so called "signature", which can be compared to a signature developed by a known, good memory circuit. Thus, in a parallel signature analyzer, the individual memory contents applied to the inputs of the parallel signature analyzer are combined through appropriate combinational logic which is known to the tester so that the desired signature can be developed.

An example of a parallel signature analyzer can be seen, for example, in co-pending U.S. patent application Ser. No. 551,667, filed Nov. 10, 1983, entitled "Universal Testing Circuit and Method", and assigned to the assignee hereof, said patent application being incorporated therein by reference as background. Such parallel signature analyzer operates in several modes relevant to the present invention. The first mode is a "scan" mode in which data is scanned into the parallel signature analyzer and made available at its output for application to a memory device under test. (As will become apparent, a "write" mode in which the contents scanned into the parallel signature analyzer are written into the memory is advanced hereinbelow, and is not a part of the art known herebefore.) A second mode is a "read" mode in which data appearing at the input to the parallel signature analyzer is received by the parallel signature analyzer and applied to its particular combinational logic, and additional subsequently applied input data is applied and combined with the earlier inputted data, and so forth, until a time after which all of the data has been applied and a particular output "signature" is generated for comparision with a known required signature.

SUMMARY OF THE INVENTION

In light of the above, it is, therefore, an object of the invention to provide an improved method and apparatus for testing very large scale integrated memory circuits.

It is another object of the invention to provide a method and apparatus of the type described in which the apparatus is fabricated onto the same semiconductor substrate as the memory elements themselves.

It is another object of the invention to provide a method and apparatus of the type described in which the memory elements of a very large scale integrated circuit can be tested more rapidly than heretofore possible through external testing methods and apparatuses.

It is another object of the invention to provide a method and apparatus of the type described in which the memory circuits can be tested in an abbreviated, yet reliable, fashion to reduce the testing time thereof.

It is another object of the invention to provide a method and apparatus of the type described which does not significantly increase the cost of fabrication of the ultimate memory device and can be constructed onto the semiconductor substrate itself as a part of the overall circuit.

These and other objects, features and advantages will become apparent to those skilled in the art from the following detailed description when read in conjunction with the accompanying drawings and appended claims.

The invention, in one of its broad aspects, presents an apparatus for testing high density memory elements constructed on a semiconductor chip, the memory elements having a plurality of bit lines connected to conduct read and write signals to respective selected memory elements. The apparatus includes at least one parallel signature analyzer built onto the chip. The parallel signature analyzer is directly or indirectly connected to at least some of the bit lines of the memory cells to enable it to communicate with those selected memory cells. The parallel signature analyzer is configured to apply selected signals onto the bit lines to write information into the memory cells to generate preselected memory states within the memory cells. The parallel signature analyzer additionally selectively reads the states of the memory cells to develop a signature of the memory cells in accordance with the particular states read. Finally, the parallel signature analyzer provides means for delivering the signature to an output lead of the semiconductor chip for comparison with a known signature to indicate whether the memory states read from the memory elements are as expected, indicating that the memory elements are properly functioning.

In another broad aspect of the invention, a method is presented for testing memory chips of the type having at least one array of memory elements formed on a single chip. The method includes providing a parallel signature analyzer on the chip for at least one of the memory arrays on the chip. The parallel signature analyzer is operable to selectively apply signals to be written into at least selected ones of the memory element in one mode, to write the signals into the memory in a second mode, and to selectively read the contents of the selected ones of the memory elements in a third mode. The parallel signature analyzer is then operated to generate a signature from the contents of the memory elements read. Finally, means are provided for selecting the operating mode of the parallel signature analyzer.

BRIEF DESCRIPTION OF THE DRAWING

The invention is illustrated in the accompanying drawing wherein.

In the various figures of the drawing, like reference numerals are used to denote like or similar parts. In addition, in FIGS. 1 and 2, the sizes or dimensions of various elements have been exaggerated or distorted for clarity of illustration and ease of description.

DETAILED DESCRIPTION OF THE PREFERRED EMBODIMENTS

Figure 1:
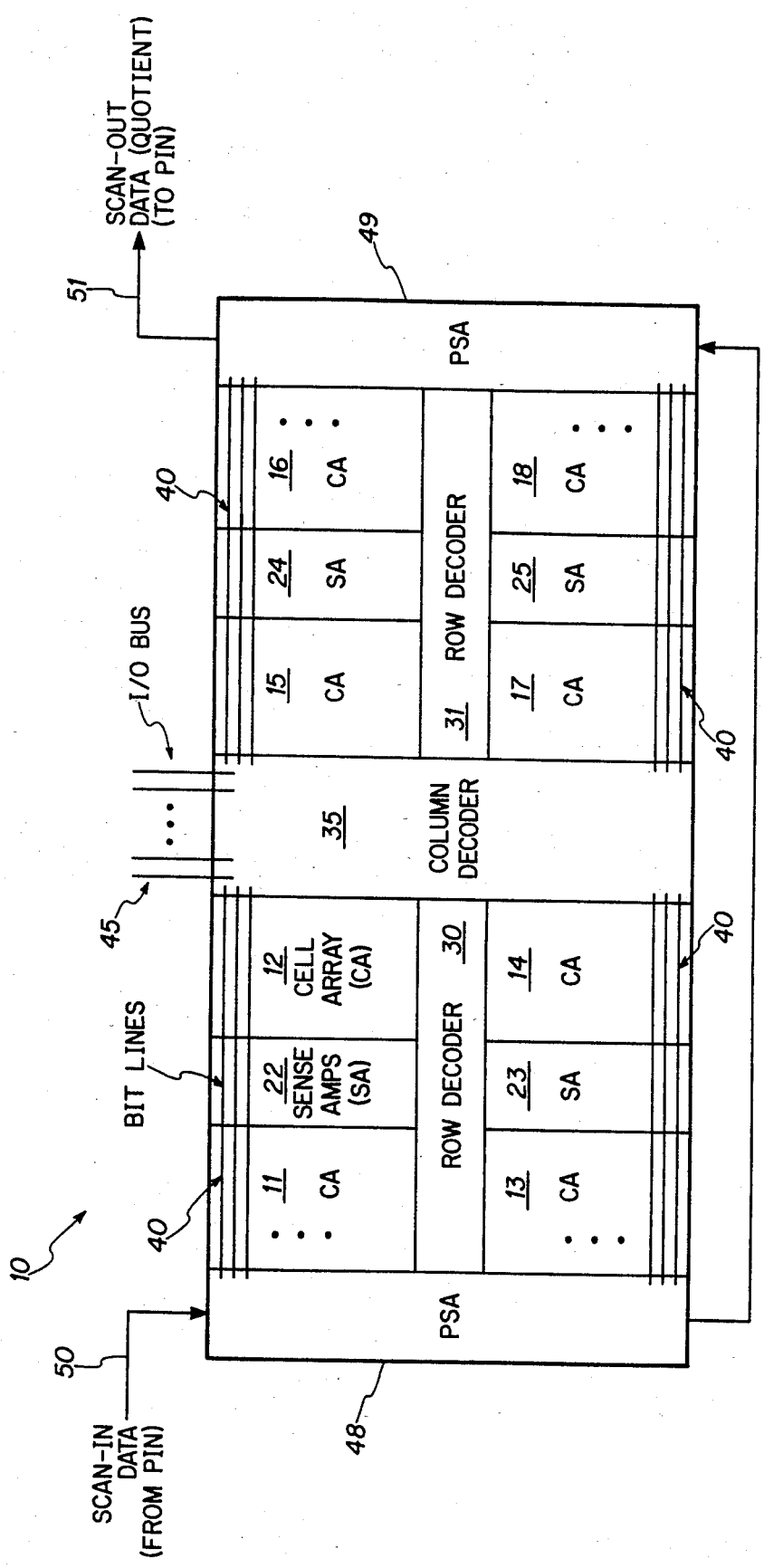
FIG. 1 is a plan view of a typical VLSI memory chip showing the relationship of a typical memory element arrangement in conjunction with the testing apparatus in accordance with the invention.

The present invention is intended for use in conjunction with very large scale integrated (VLSI) memory circuits in which at least one memory cell array is fabricated onto a semiconductor substrate, together with appropriate row and column memory decoders, as is well known in the art. An example of a typical memory array in conjunction with which the testing apparatus and method of the invention can be used is shown in "A sub-100 nanoseconds 256K DRAM in CMOS III technology," International Solid State Circuits Conference, 1984, by Roger I. Kung et al at 278 et seq. As shown in FIG. 1, a typical LSI memory 10 includes 8 memory cell arrays, 11-18. Each one of memory cell arrays 11-18 may include a number of individual memory cells, such as, for example, 32K by 1. Each pair of cell arrays 11-12, 13-14, 15-16, 17-18 includes between them a number of sense amplifiers 22, 23, 24, and 25, respectively. Row decoders 30 and 31 are disposed between respective cell arrays 11-12, 13-14 and between cell arrays 15-16 and 17-18 to decode the vertical lines connected to the memory elements (not shown). Similarly, the column decoder 35 is disposed between the set of cell arrays 11-12 and 13-14 and cell arrays 15-16 and 17-18, as shown. A plurality of bit lines 40 are included in the memory array 10, interconnecting the various memory elements of the memory cell arrays 11-18 with the column decoder 35 to apply and remove signals to and from the respective memory elements of the cell arrays 11-18. Finally, an input/output bus 45 is provided from the column decoder 35 for communication with the memory 10. The memory array thus described is as typically fabricated in the prior art. Typically, such memory array is fabricated onto a single semiconductor substrate (not shown) in as efficient a manner as possible. (In fact, the number of memory elements which can be included in the memory array 10 is directly related to the efficiency with which the memory element arrays can be located onto the semiconductor substrate.)

With further reference to FIG. 1, and in accordance with the invention, a pair of parallel signature analyzers 48 and 49 are fabricated onto the semiconductor substrate (not shown) in proximity to the memory arrays 11-18. More specifically, as shown in the embodiment of FIG. 1, parallel signature analyzer 48 is constructed adjacent to memory cell arrays 11 and 13 and the parallel signature analyzer 49 is constructed adjacent to the memory cell arrays 16 and 18. It will be appreciated that the particular location of the parallel signature analyzers 48 and 49 can be determined with various considerations, such as the degree of testing required of the memory array 10, the amount of semiconductor "real estate" available under which it can be constructed, and so on, as will be apparent to those skilled in the art. In addition, the bit lines 40 are connected to the respective parallel signature analyzers to conduct the signals from the respective cell areas 11-18, as below described in detail.

As will become apparent, the parallel signature analyzers 48 and 49 operate in two different modes. The first mode is the so called "signature" mode to monitor or read data from the multiple memory cells in parallel during a memory read cycle. The second mode is a "scan mode" to serially scan data from outside the chip into the parallel signature analyzer so that multiple memory cells can be written in parallel during memory write cycles in the "write" mode, described below. In the scan mode, data can also be scanned out to form the final signature. The third mode is a "write" mode in which the contents of the parallel signature analyzer is transferred or written into the memory.

As will become apparent, in the particular testing approach of the testing apparatus illustrated in FIG. 1, every bit line 40 between the memory elements and column decoder 45 is connected to the parallel signature analyzers 48 and 49, thus achieving the maximum possible parallelism, since every bit line is monitored. As shown, the parallel signature analyzer size in the embodiment illustrated is maximum, including a number of flip-flops (described below with reference specifically to FIG. 3) equal to or greater than the number of bit lines. For example, if the memory array 10 has 1024 bit lines (with 1024 sense amplifiers) then the parallel signature analyzers 48 and 49 will be at least of size equal to 1024. It should be noted that the size of the parallel signature analyzer should at least be equal to the number of bit lines being monitored. However, the size of the parallel signature analyzer can be selected to be greater than the number of bit lines to enhance the probability of detecting errors in the data compressed by the parallel signature analyzer. Thus, if the number of flip-flops in the parallel signature analyzers 48 and 49 are equal to the number of bit lines, every flip-flop stage in the parallel signature analyzer monitors exactly one bit line. On the other hand, if the parallel signature analyzer is of size larger than the number of bit lines, some selected flip-flop stages in the parallel signature analyzer do not receive any parallel data input. Thus, in operation, the parallel signature analyzers 48 and 49 receive scanned-in data at its least significant bit position, indicated by the arrow 50, from an input pin of the memory chip (not shown). In addition, its most significant bit (MSB), also called the quotient bit, is connected to an output pin of the memory chip, as indicated by the output arrow 51. These connections are necessary to scan out the contents of the parallel signature analyzer, or to scan in any data which should be written into the memory array 10 using the parallel signature analyzers 48 and 49.

Figure 2:
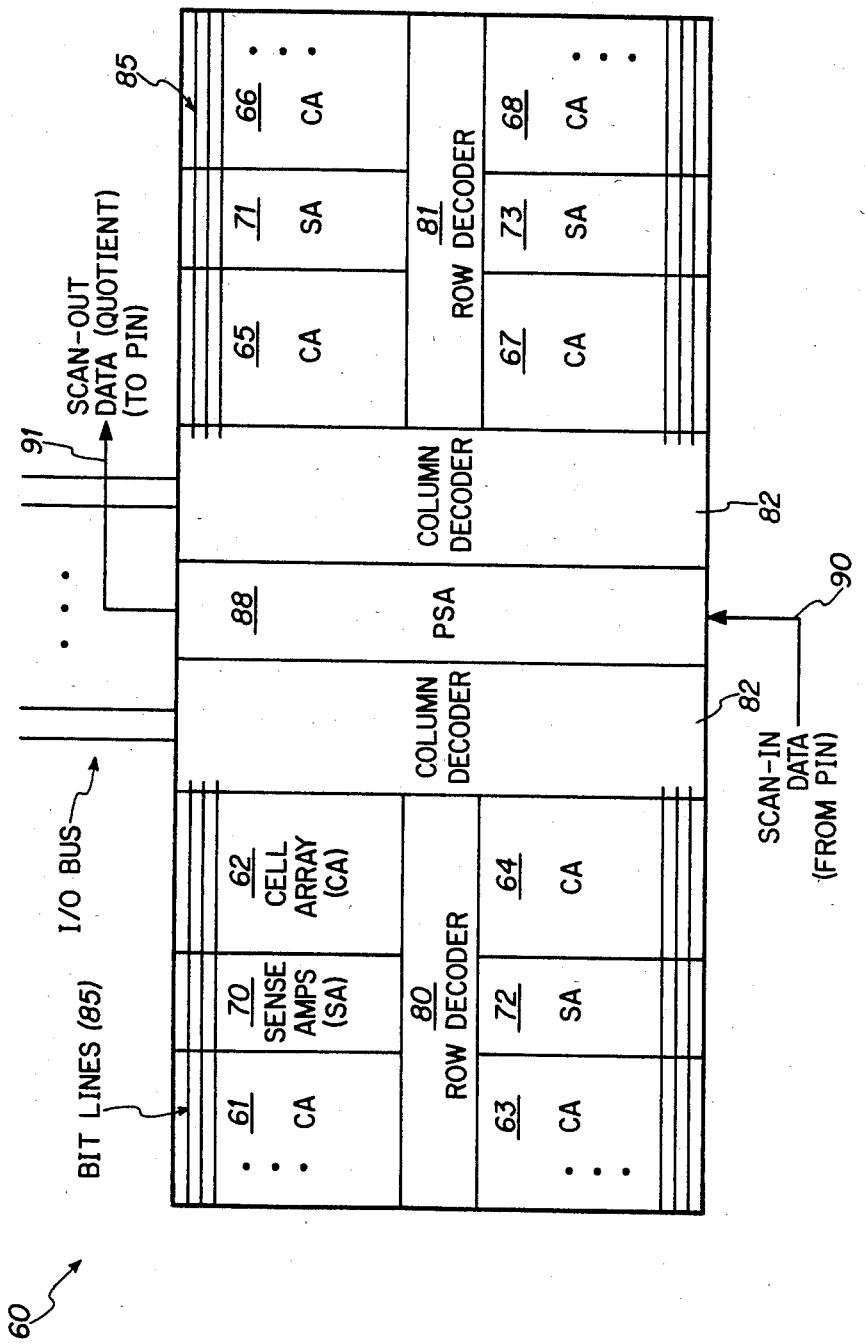
FIG. 2 is a plan view of a VLSI memory chip showing an alternative preferred embodiment of the testing apparatus in accordance with the invention in relationship to a typical memory element arrangement.

Another embodiment of the invention is shown in FIG. 2 in which the memory array 60 includes memory cell arrays 61-68 having sense amplifiers 70-73 and row decoders 80 and 81 and column decoder 82 connected in a fashion similar to that described above with reference to the memory of array of FIG. 1. In the embodiment of FIG. 2, a plurality of bit lines 85 interconnect the respective memory elements of the cell arrays 61-68 to the column decoder 82, in a fashion similar to that described above. In the embodiment of FIG. 2, a single parallel signature analyzer 88 is provided within the column decoder 82, connected to receive only selected ones of the bit lines 85. Thus, in FIG. 2 the parallel signature analyzer is integrated with the column decoder in such a way that it monitors only a fraction of the available bit lines as selected by the early stages (not shown) in the column decoder 88. For example, if there are 1024 bit lines coming into the column decoder 82, then the parallel signature analyzer can have either 512, 256, 128, 64, 32, 16, or 8 stages. Again, the parallel signature analyzer 88 includes an input port to receive scan in data from a pin (not shown) on the chip, as indicated by the arrow 90. Similarly, the scan out data (or quotient line bit) is presented at an output port of the parallel signature analyzer 88 to be removed from an output pin (not shown) as indicated by the arrow 91.

Figure 3:
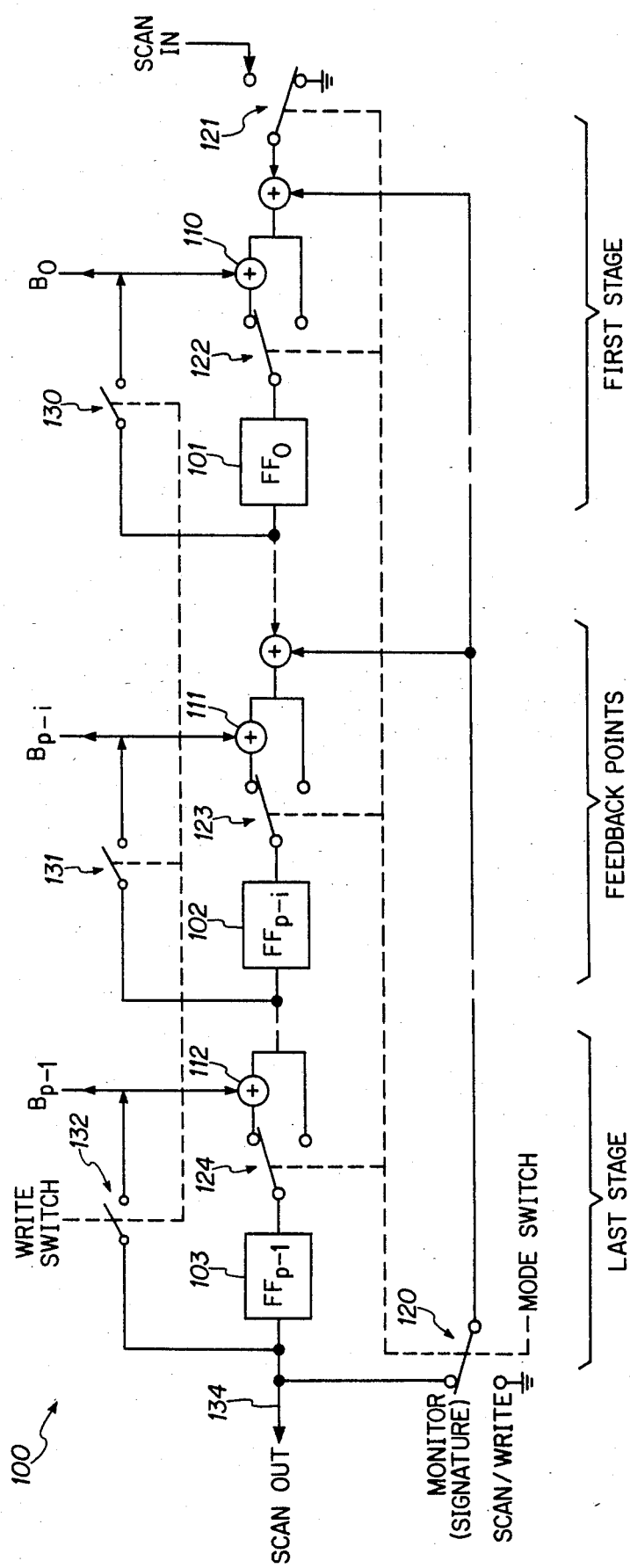
FIG. 3 is an electrical schematic diagram showing the details of a parallel signature analyzer which can be used in the testing apparatus of FIGS. 1 and 2.

The parallel signature analyzers 48, 49, and 88, of FIGS. 1 and 2 can be each constructed in the general manner shown by the block diagram in FIG. 3. As shown, the parallel signature analyzer 100 comprises a number, p, of master-slave flip-flop stages 101-103. The inputs of the flip-flop stages 101-103 are connected to the parallel input or bit lines, $B_o, \ldots, B_{p-i} \ldots, B_{p-1}$, through exclusive-OR gates 110, 111, 112, respectively. The other input of each flip-flop 101-103 is connected to the output of the previous flip-flop stage through the respective exclusive-OR gates 110-112, with the exception of the first flip-flop 101, which receives its input from the output of the last flip-flop stage 103.

A mode switch 120 is provided to switch the parallel signature analyzer circuit 100 between "monitor", and "scan/write" modes, the "scan" mode being used to input data into the parallel signature analyzer to be written into the memory elements to be tested, the "write" mode being used to write the data in the parallel signature analyzer into the memory, and the "monitor" mode being used to read the outputs produced by the respective memory elements under test. A second switch 121 is also provided to connect the first flip-flop stage 101 to a "scan in" terminal, which receives scanning data from a pFin (not shown) on the chip. Switches 122, 123, and 124 are provided to connect the output from the previous flip-flop directly to the input of the flip-flop with which each of the switches 122-124 is respectively associated. As shown, each of the switches 120-124 are ganged together to all simultaneously operate when the mode switch 120 is operated between the "monitor" and "scan" mode selection positions. Finally, write switches 130, 131, and 132 are provided to selectively connect the output of each of the flip-flops 101-103 to the bit lines $B_o, \ldots, B_{p-i}, \ldots, B_{p-1}$. Again, switches 130-132 are ganged together to be simultaneously operated when it is desired to write data into the memory elements with which the parallel signature analyzer is associated.

Figure 4:
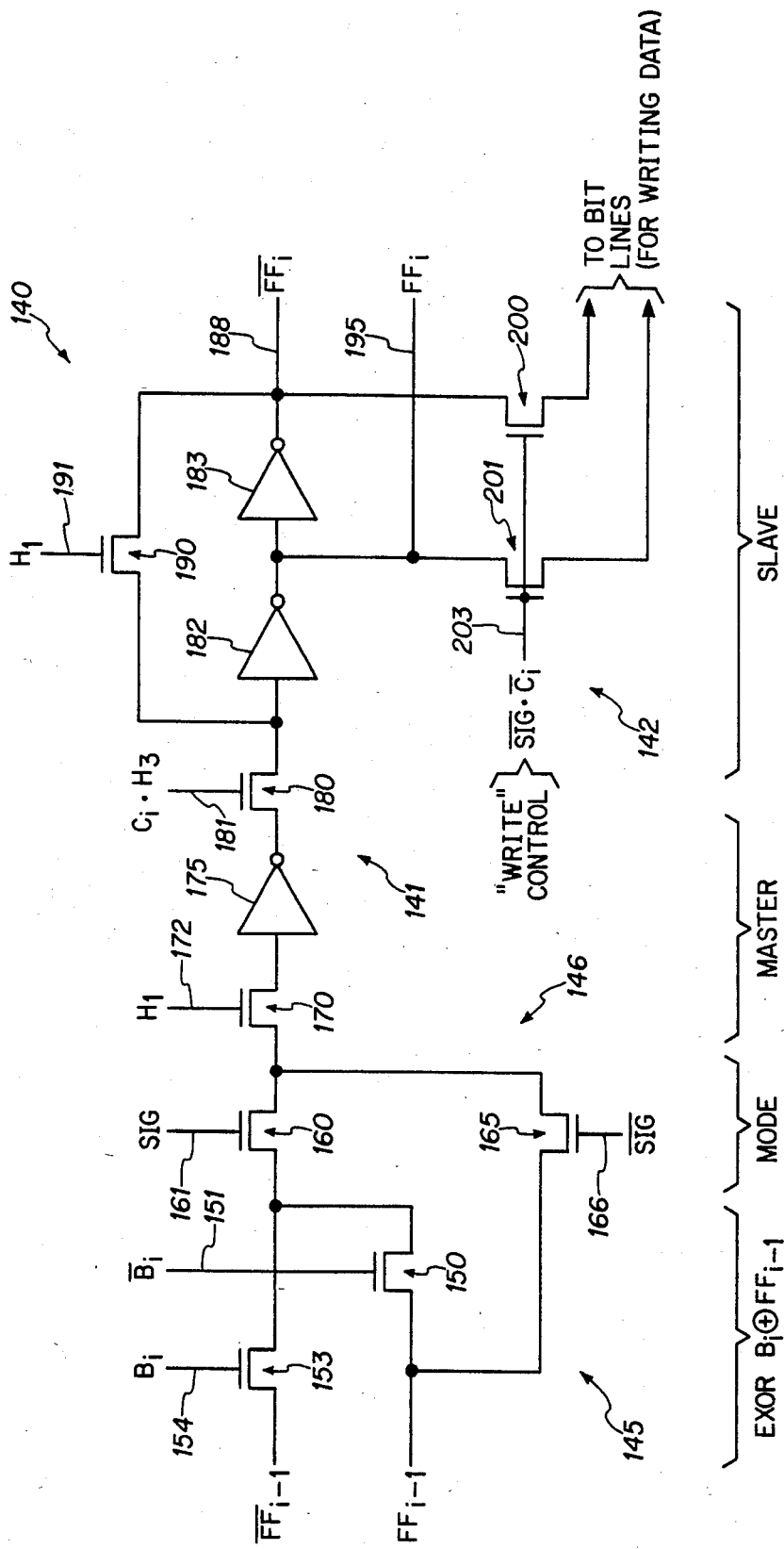
FIG. 4 is an electrical schematic diagram of one stage of the parallel signature analyzer of FIG. 3.

The details of a typical one of the flip-flop stages of the parallel signature analyzer 100 is shown in FIG. 4. Thus, as shown by the legend along the bottom of FIG. 4, a master-slave flip-flop 140 includes a master driver section 141 followed by a slave follower section 142. The input to the master-slave flip-flop 140 is derived from an exclusive-OR gate section 145 followed by a mode select section 146. The input to the exclusive-OR section 145 is derived from the output of the next preceeding flip-flop stage (not shown) in which the output is applied to a transistor 150, which has its control element connected to an inverted bit line 151. Additionally, an inverted output from the next preceeding stage is connected to a transistor 153, which has its control element connected to the bit line 154. The output of transistors 150 and 153 are connected to a transistor 160 having its control element connected to a non-inverted mode control signal on line 161. In similar fashion, the non-inverted output of the next preceeding flip-flop stage is connected to a transistor 165 having its control element connected on line 166 to an inverted mode control signal. The output from transistors 160 and 165 are connected to the input of a transistor 170 having its control element connected to a clock signal, $H_1$ on line 172, and the output of the transistor 170 is connected to an inverter 175, the combination of transistor 170 and inverter 175 comprising the master driver for the master-slave flip-flop section 140. The output of the inverter 175 is connected to the transistor 180 having its control element connected to receive on line 181 a signal representing the logical AND combination of a "write" control signal and a second clock signal, designated $H_3$. (It should be noted that $H_1$ and $H_3$ are non-overlapping clock signals.) The output of the transistor 180 is connected to respective inverters 182 and 183 to produce an inverted flip-flop output on line 188 from the slave portion of the flip-flop 140. The input to the inverter 182 is additionally connected to a transistor 190 having its control element connected to the first clock signal $H_1$ on line 191, and its output is connected to the output of the second inverter stage 183. Additionally, the output of the first inverter stage 182 provides a noninverted output of the flip-flop 140 on line 195. The respective inverted and noninverted outputs are connected to transistors 200 and 201, both of which have their control elements connected on line 203 to a "write" control signal, representing the logical AND combination of an inverted mode control signal and a "write" control signal. The outputs of the respective transisters 200 and 201 are connected to the bit lines (not shown) of the memory elements with which the parallel signature analyzer is associated, as indicated above.

Thus, in operation with particular reference to FIG. 3, the test data to be applied to the memory elements to effect the desired test is scanned into the parallel signature analyzer 100, with the mode switch 120 and the ganged switches 121-124 in the "scan/write" position. The data, therefore, is clocked into the respective flip-flops 101-103 for application to the bit lines of the associated memory. The write switches 130-132 are then operated to conduct the output of each of the flip-flop stages 101-103 to the respective bit lines $B_O, \ldots, B_{p-i}, \ldots,$ and $B_{p-i}$, to be further applied to the respective associated memory elements. The mode switch 120 and its associated gang-connected switches 121-124 are then moved to the "monitor" or "signature" mode position, and the data read on the bit lines $B_O, \ldots, B_{p-i}, \ldots,$ and $B_{p-i}$ are clocked out of the parallel signature analyzer on line 134, thereby forming a desired signature respresentative of the data read from the memory elements with which the parallel signature analyzer 100 is associated. It can be seen that if the scanned out signature is different from that expected or obtained from normally operating memory elements, one or more of the memory elements is malfunctioning and the memory unit fails its test.

It should be appreciated that the memory chip can be tested using any memory test algorithm, and, as the device is being tested, the parallel signature analyzer accumulates the signature during the entire execution of the test algorithm and the final signature is read out in the scan mode. In a scan mode the parallel signature analyzer functions as a simple shift register, with the scan-in data being fed to the least significant bit of the shift register.

During memory testing, memory chips are usually tested for functionality and additionally for adjacent cell interference using conventional memory test algorithms, like "marching 1's" and 0's, "walking 1's" and 0's, Galpat, and so forth. During the execution of any such test algorithm, a p-bit parallel signature analyzer, implemented as described above, can monitor the test responses from the cells during every read cycle. In other words, instead of reading out the contents of only a few memory cells via the available input/output pins during a read cycle, the parallel signature analyzer will read p cells, in parallel. It can be seen, therefore, that the use of the parallel signature analyzer in accordance with the invention will result in a reduction in the number of required memory read cycles. The memory cells monitored by the parallel signature analyzer can be treated as a single block or entity, and is the target in the test algorithm, during a read cycle, instead of only words having the width equal to the available input/output pins. In every read cycle the parallel signature analyzer updates its contents with the new data provided by the selected p cell block.

During the execution of the test algorithm, the output data from the memory elements is not monitored by an external tester; instead, at the end of the test algorithm, only the final signature accumulated in the parallel signature analyzer is scanned out on one of the input/output pins and verified by the tester, and, as mentioned, the final signature contains sufficient information to determine whether the memory chip is faulty or not.

The quotient bit line 134 of the parallel signature analyzer 100 can be monitored as well. Usually, the error detection capability of large parallel signature analyzers is very high when only the final signatures are verified. However, the error detection capability can be significantly enhanced, if desired, by monitoring the quotient bit of the parallel signature analyzer, in addition to verifying the final signature. The monitoring of the quotient bit is straightforward since the most significant bit of the parallel signature analyzer connected to an input/output pin (see FIGS. 1 and 2) for scanning out its final signature. Therefore, the already available data can be continuously verified by an external tester (not shown) by monitoring only one output pin.

Another advantage of the parallel signature analyzer of the invention is that the parallel signature analyzer can be used to reduce the number of memory write cycles during the execution of a memory test algorithm. For example, with the parallel signature analyzer in the scan/write mode, any desired pattern required to be written into the memory cells is first scanned into the parallel signature analyzer. Next, with the help of the write switch 130-132 (see FIG. 3) the parallel signature analyzer contents can be written into all p memory cells in one memory write cycle. The number of write cycles can, therefore, be reduced if the same pattern stored in the parallel signature analyzer is to be written into different p cell memory blocks. This is true, for example, during the initialization of the entire memory with some regular pattern, like all 0's, all 1's, alternate 1's and 0's, and so forth. During such an initialization step, the number of memory write cycles could be reduced from n to n/f. Also, with the simple shift operation in the parallel signature analyzer a new pattern can be generated from the previously scanned-in pattern. This will save p cycles required to scan-in a new pattern.

In addition, during the execution of a memory test algorithm, it is possible to perform a write operation via the parallel signature analyzer. This is accomplished just before a write operation in which the current contents of the parallel signature analyzer should not be destroyed, since they represent the signature of the data compressed by the parallel signature analyzer up to that time during the execution of the test algorithm. Thus, whenever the parallel signature analyzer is to be used for writing into a memory block, its current contents are scanned out and verified by the external tester. The two operations of scanning in the new data to be written into the memory cells and scanning out the present contents of the parallel signature analyzer can be done concurrently, since the scan-in data is fed into the least significant bit of the parallel signature analyzer while the scan-out data is taken from the most significant bit. In fact, whenever new data is scanned into the least significant bit of the parallel signature analyzer, the parallel signature analyzer coontents are automatically scanned out via its most significant bit. Thus, it is possible to reduce the number of memory write cycles in the middle of the execution of a test algorithm.

Although the invention has been described and illustrated with a certain degree of particularity, it is understood that the present disclosure has been made by way of example only and that numerous changes in the combination and arrangement of parts may be resorted to by those skilled in the art without departing from the spirit and the scope of the invention as hereinafter claimed.

I claim:

1. A system for testing a high density memory on a chip, comprising;
    a high density memory with plural memory cells formed on a single semiconductor chip;
    a plurality of bit lines connected to the memory cells of said high density memory;
    at least one parallel signature analyzer disposed on said chip adjacent the high density memory;
    said parallel signature analyzer including:
    means coupled to said bit lines for selectively applying signals onto said bit lines to be written into the memory cells of said high density memory;
    means for selectively reading memory states of the memory cells of said high density memory;
    and means responsive to said read memory states for developing a signature from the memory states read for indicating whether the selectively applied signals were properly written into and read from the memory cells of said high density memory wherein said parallel signature analyzer comprises a multiple input linear feedback shift register wherein said shift register comprises a plurality of flip-flops, each having an input connected to a bit line of a respective one of said memory elements through an exclusive-OR gate and to an output of a preceding flip-flop through said exclusive-OR gate.

2. The apparatus of claim 1 wherein said parallel signature analyzer comprises means for providing a quotient bit line to provide a signature output from said parallel signature analyzer.

3. The apparatus of claim 2 wherein said parallel signature analyzer comprises means for providing a quotient bit line to provide a signature output from said parallel signature analyzer.

4. Apparatus for testing high density VLSI memory elements of a semiconductor chip, connections to at least selected ones of which being made by a plurality of bit lines, comprising:
    a semiconductor chip having memory elements,
    a plurality of bit lines connected to selected ones of said memory elements,
    two parallel signature analyzers built into said chip, adjacent said memory elements and connected to at least some of said bit lines,
    said parallel signature analyzers including means to apply selected signals onto said bit lines to enable information to be written into at least said selected memory cells to generate preselected memory states therewithin, and to read the states of said memory cells, said parallel signature analyzers further including means to develop a signature of said memory cells in accordance with the states read,
    means for delivering said signature to an output lead.

5. The apparatus of claim 4 wherein each of said parallel signature analyzers comprises a single parallel signature analyzer arranged between two sets of said memory elements.

6. The apparatus of claim 4 wherein said parallel signature analyzer comprises a multiple input linear feedback shift register.

7. The apparatus of claim 6 wherein said parallel shift register comprises a plurality of flip-flops, each having an input connected to a bit line of a respective one of said memory elements through an exclusive-OR gate and to an output of a preceding flip-flop through said exclusive-OR gate.

8. The method of testing a memory chip of the type having at least one array of memory elements formed thereon, comprising:
    providing a memory chip of the type having at least one array of memory elements formed thereon,
    providing a parallel signature analyzer on said chip for each of said at least one array, operable to selectively apply signals to be written into selected memory elements in one mode, to selectively read the contents of said memory elements in another mode, and to generate a signature from the contents read to indicate whether the applied signals were properly written into and read from said memory elements;
    and providing means for selecting the operating mode of said parallel signature analyzer wherein said step of providing a parallel signature analyzer comprises providing a multiple input linear feedback shift register into said chip for each said at least one array of memory elements, wherein said step of providing a shift register comprises forming into said chip a plurality of flip-flops, each having an input connected to a bit line of a respective one of said memory elements through an exclusive-OR gate and to an output of a preceding flip-flop through said exclusive-OR gate.

9. The emthod of claim 8 further including locating said parallel signature analyzer on said chip adjacent said at least one array of memory elements.

10. The method of claim 8 further including connecting said parallel signature analyzer to deliver and receive signals to and from each memory element.

11. The method of claim 8 further including connecting said parallel signature analyzer to deliver and receive signals to and from only selected ones of said memory elements.

12. The method of claim 8 further including providing a quotient bit line on said parallel signature analyzer to provide a signature output from said parallel signature analyzer.

* * * * *